United States Patent [19]

Nitta et al.

[11] Patent Number: 4,987,097

[45] Date of Patent: Jan. 22, 1991

[54] METHOD OF MANUFACTURING A SEMICONDUCTOR LASER DEVICE

[75] Inventors: Koichi Nitta, Kawasaki; Yukie Nishikawa, Narashino; Masayuki Ishikawa, Nishimine; Yasuhiko Tsuburai, Sagamihara; Yoshihiro Kokubun, Yokohama, all of Japan

[73] Assignee: Kabushiki Kaisha Toshiba, Kawasaki, Japan

[21] Appl. No.: 486,397

[22] Filed: Feb. 28, 1990

Related U.S. Application Data

[62] Division of Ser. No. 307,927, Feb. 9, 1989, Pat. No. 4,922,499.

[30] Foreign Application Priority Data

Feb. 9, 1988 [JP] Japan .................................. 63-26490
May 13, 1988 [JP] Japan ................................ 63-116704
Jul. 11, 1988 [JP] Japan ................................ 63-172312

[51] Int. Cl.$^5$ .......................................... H01L 21/20
[52] U.S. Cl. ............................. 437/129; 148/DIG. 95; 148/DIG. 157; 437/133; 437/154; 437/950; 437/987
[58] Field of Search ................. 148/DIG. 2, 3, 18, 30, 148/36, 44, 50, 56, 65, 72, 90, 95, 97, 110, 157, 169; 357/16, 17; 372/43, 46, 48, 50, 45; 437/81, 82, 90, 105, 107, 108, 110, 126, 129, 133, 247, 153, 154, 157, 165, 936, 943, 949, 950, 955, 887

[56] References Cited

U.S. PATENT DOCUMENTS

| | | | |
|---|---|---|---|
| 4,213,808 | 7/1980 | Thompson et al. | 372/46 |
| 4,517,674 | 5/1985 | Liu et al. | 372/46 |
| 4,546,479 | 10/1985 | Ishikawa et al. | 372/46 |
| 4,635,268 | 1/1987 | Motegi et al. | 372/46 |
| 4,675,074 | 6/1987 | Wada et al. | 437/129 |
| 4,734,385 | 3/1988 | Mihashi et al. | 437/129 |
| 4,792,958 | 12/1988 | Ohba et al. | 372/45 |
| 4,799,228 | 1/1989 | Nagasaka et al. | 372/46 |
| 4,839,307 | 6/1989 | Imanaka et al. | 437/129 |

FOREIGN PATENT DOCUMENTS 0066891 4/1985 Japan .
0137088 7/1985 Japan .
62-16592 1/1987 Japan .
62-200784 9/1987 Japan .

OTHER PUBLICATIONS

Yamashita et al., "GaAlAs Gain-Guided Semiconductor Lasers . . . ", Appl. phys. Lett., vol. 51, No. 21, Nov. 23, 1987, pp. 1667-1669.

Primary Examiner—Olik Chaudhuri
Assistant Examiner—William Bunch
Attorney, Agent, or Firm—Oblon, Spivak, McClelland, Maier & Neustadt

[57] ABSTRACT

A gain waveguide type semiconductor laser oscillating visible light has an N type GaAs substrate of, and a double-heterostructure provided above the substrate to include an InGaP active layer, and first and second cladding layers sandwiching the active layer. The first cladding layer consists of N type InGaAlP, whereas the second cladding layer consists of P type InGaAlP. A P type InGaP layer is formed as an intermediate band-gap layer on the second cladding layer. An N type GaAs current-blocking layer is formed on the intermediate band-gap layer, and has an elongated waveguide opening. A P type GaAs contact layer is formed to cover the current-blocking layer and the opening. The intermediate band-gap layer has a carrier concentration, in a layer portion being in contact with the opening, high enough to cause a current injected in the oscillation mode to concentrate on the layer portion and has a carrier density, in the remaining layer portion, low enough to suppress or prevent the injected current from spreading thereinto. The layer portion may be formed by additionally doping a selected impurity into the intermediate gap layer by using a presently available impurity diffusion/injection technique.

7 Claims, 22 Drawing Sheets

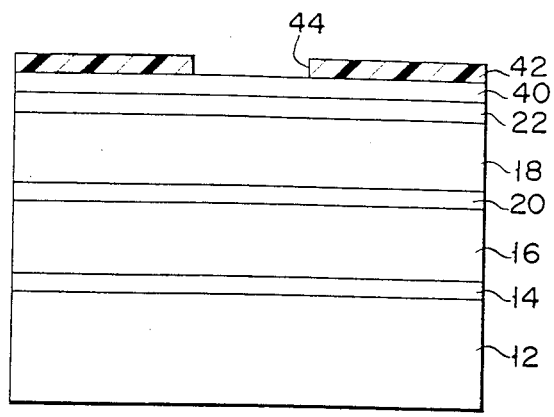
F I G. 2A
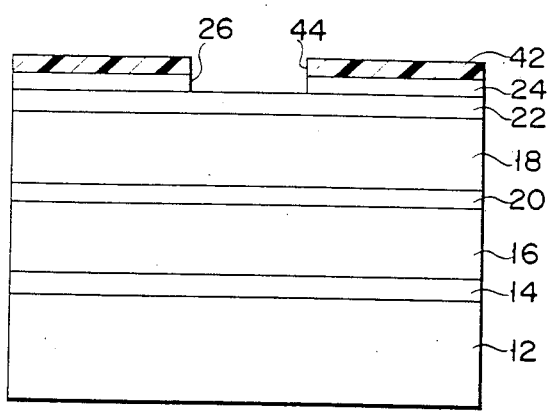
F I G. 2B
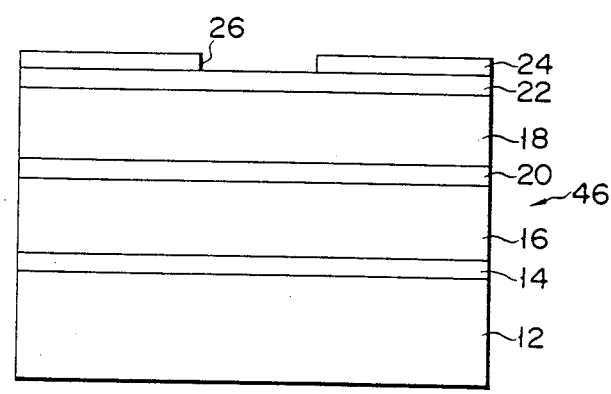
F I G. 2C

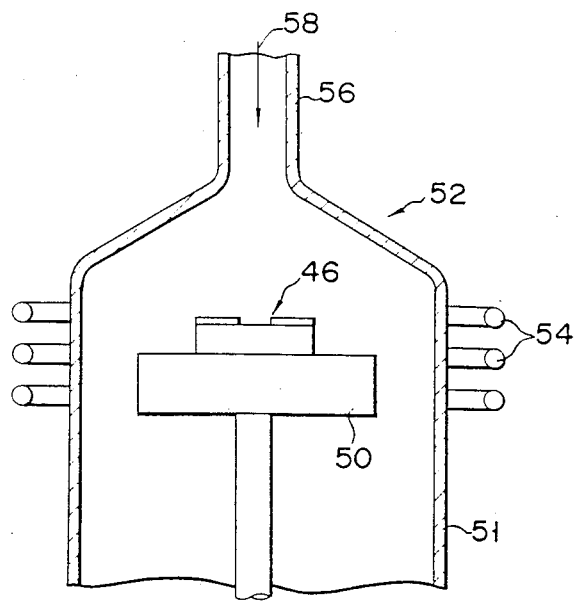
F I G. 3
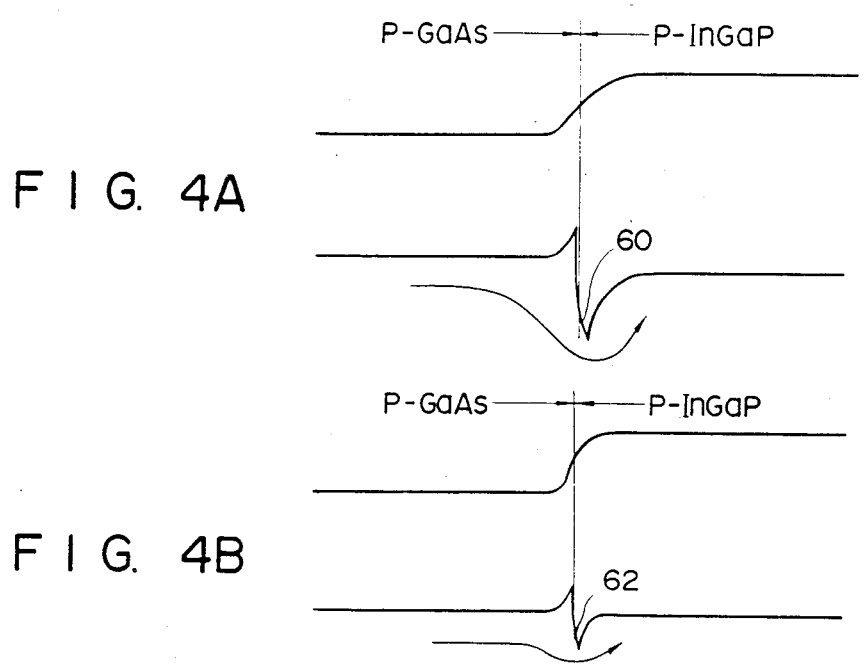
F I G. 4A
F I G. 4B

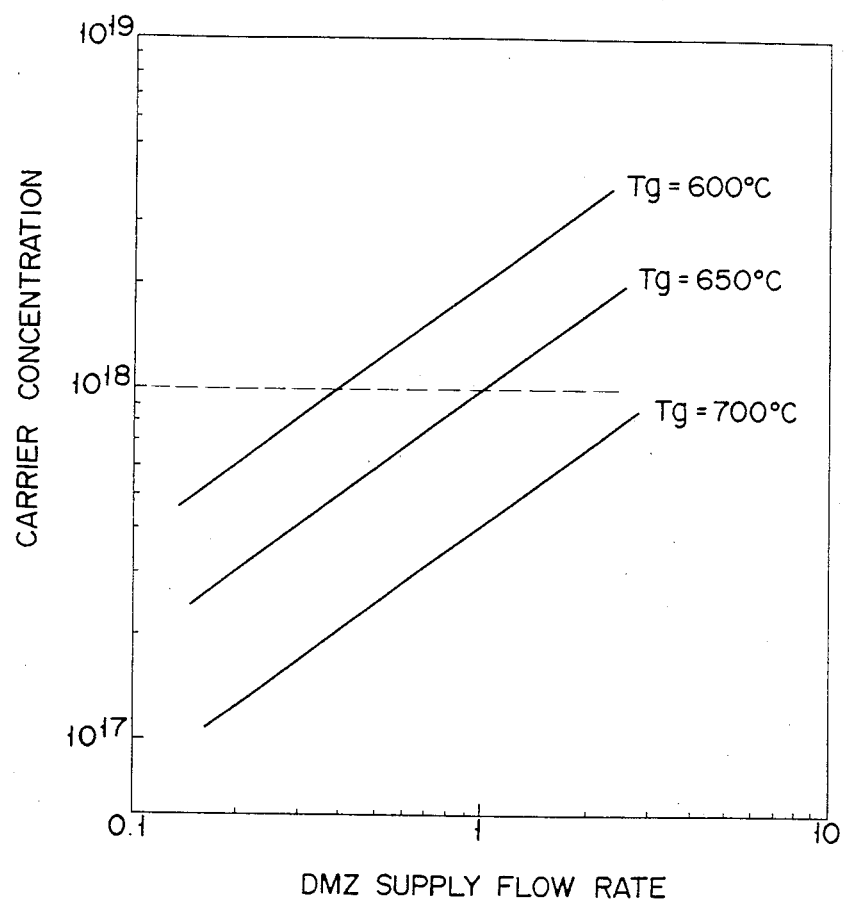
F I G. 5

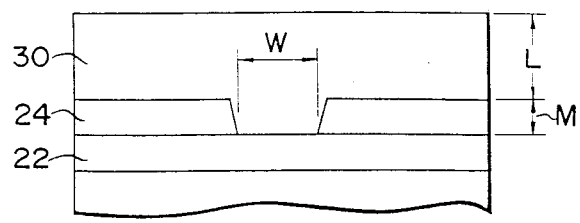
F I G. 7
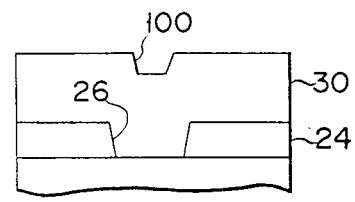
F I G. 9A
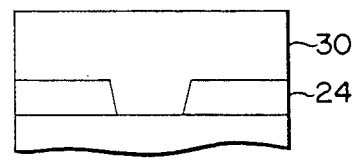
F I G. 9B

METHOD OF MANUFACTURING A SEMICONDUCTOR LASER DEVICE

This is a division of application Ser. No. 07/307,927, filed on Feb. 9, 1989, Pat. No. 4,922,499.

BACKGROUND OF THE INVENTION

1. Field of the Invention

The present invention relates to semiconductor light-emitting devices and, more particularly, to a semiconductor laser device for oscillating a laser beam of a visible light range.

2. Description of the Related Art

Recently, of semiconductor laser devices, a great deal of attention has been paid to a laser for emitting a laser beam of a visible light range, e.g., a red light beam having a wavelength of 670 to 680 nanometers. For example, a gain waveguide type semiconductor laser for emitting a red light beam has a gallium arsenide (to be referred to as "GaAs" hereinafter)-based III-V Group semiconductor laminated structure. Typically, this laminated structure has a double-heterostructure, which consists of a first cladding layer constituted by an N type indium/gallium/aluminum/phosphorus (to be referred to as "InGaAlP" hereinafter) layer formed above a GaAs substrate of an N type conductivity, an active layer formed on the first cladding layer, and a second cladding layer constituted by a P type InGaAlP layer formed on the active layer.

Current-blocking layers are formed on the second cladding layer, and are constituted by N type GaAs layers. These current-blocking layers define an elongated, i.e., stripe-like waveguide opening. A P type GaAs contact layer is formed so as to cover the current-blocking layers. The contact layer is formed thick enough to make its top surface substantially flat. Conductive layers serving as laser electrodes are formed on the two opposite surfaces of such a laser laminated structure. When a device having such a structure is excited, a current is blocked by that portion of a PN-inverted layer between the current-blocking layers and the second cladding layer which corresponds to the opening, thereby providing laser beam oscillation along the length of the opening (i.e., oscillation of a stripe-shaped laser beam).

In the above-described laser structure, a P type semiconductive layer is formed between the second cladding layer and the current-blocking layers. The P type semiconductive layer has a band gap corresponding to an intermediate value between the band gaps of the second cladding layer and the contact layers. This layer functions to reduce a change in band gap between the second cladding layer and the contact layers, and is generally known as an "intermediate band-gap layer". The current-blocking layers define the above waveguide opening on the surface of the intermediate band-gap layer. In order to form such a waveguide opening, an N type GaAs layer which is formed on the intermediate band-gap layer in advance is etched by a known etching technique.

The conventional laser having the above-described laminated structure, however, suffers from the following problem. When laser beam oscillation is to be performed, incomplete current blocking in the intermediate band-gap layer causes an excitation current to undesirably spread in a lateral direction in the intermediate band-gap layer. Such spreading of a current in the intermediate band-gap layer decreases the oscillation efficiency of a laser beam.

In order to prevent the "current spreading" phenomenon, the carrier densities and thicknesses of the second cladding layer and the intermediate band-gap layer must be controlled with high accuracy. If the carrier density of the intermediate band-gap layer is decreased to prevent "current spreading", the series resistance of the device is undesirably increased. It is difficult to control the thickness of the intermediate band-gap layer with high accuracy for the following reasons. In the process of etching the N type GaAs layer to form the waveguide opening, it is very difficult to control the etching process so as to accurately stop etching progress at the top surface of the underlying layer (i.e., the intermediate band-gap layer) in consideration of the current technical level of etching. If overetching occurs in the intermediate band-gap layer due to insufficient etching precision, an initially set proper thickness of the intermediate band-gap layer cannot inevitably be obtained. Since an overetching amount is not necessarily constant in a manufacturing process, even if the thickness of the intermediate band-gap layer is set a little larger than necessary so as to compensate an overetching amount, the intermediate band-gap layer of a manufactured device does not necessarily have an optimal thickness. If the initial thickness of the intermediate band-gap layer is changed for each device, manufacturing yield is decreased. If the material for the intermediate band-gap layer is replaced with a gallium/aluminum/arsenic (GaAlAs) material, the problem of "overetching" can be solved. However, the carrier density of the intermediate band-gap layer is decreased. As a result, the series resistance of a semiconductor laser device is increased, thus posing another problem.

SUMMARY OF THE INVENTION

It is, therefore, an object of the present invention to provide a new and improved semiconductor laser device which can effectively perform blocking of an oscillation current and can be manufactured at high manufacturing yield.

It is another object of the present invention to provide a new and improved method of manufacturing a semiconductor laser device, by which a semiconductor laser device capable of effectively performing blocking of an oscillation current can be manufactured at high manufacturing yield.

In accordance with the above objects, the present invention is addressed to a specific semiconductor laser device, which has:

a semiconductive substrate having a first conductivity type; and a double-heterostructure disposed above the substrate, which includes a semiconductive active layer, and first and second cladding layers sandwiching the semiconductive active layer and having different conductivity types. The first cladding layer is composed of a semiconductive material having the first conductivity type; the second cladding layer is composed of a semiconductive material having a second conductivity type. A semiconductive layer is formed on the second cladding layer. A current-blocking layer of the first conductivity type is formed on the semiconductive layer and has an elongated opening. The semiconductive layer has the first or second conductivity type. A semiconductive contact layer having the second conductivity type is formed so as to cover the current-blocking layer and the opening. The semiconductor layer has a band gap corresponding to an intermediate value between the band gaps of the second cladding layer and the contact layer, thus functioning as an intermediate band-gap layer. The intermediate band-gap layer has, at a layer portion which is in contact with the opening, a carrier concentration high enough to cause a current injected in an oscillation mode of the device to be substantially concentrated in the layer portion, and has, at the remaining layer portion, a carrier concentration low enough to suppress or prevent the injected current from spreading in this portion. With such an arrangement, the injected current can be substantially concentrated only in the heavily-doped portion of the intermediate band-gap layer. Therefore, an oscillated laser beam can be blocked in a waveguide channel portion of the laser device along the length of the opening. As a result, an effective current blocking operation can be provided while an increase in series resistance of the device is suppressed. In addition, since the heavily-doped layer portion can be easily manufactured by only doping a selected impurity in the intermediate band-gap layer in an additional manner in the semiconduct crystal growth process, efficient manufacture of such laser devices can be performed without much difficulty even in consideration of the current technical level of manufacturing.

The present invention and its objects and advantages will become more apparent by the detailed description of a preferred embodiment presented below.

BRIEF DESCRIPTION OF THE DRAWINGS

In the detailed description of a preferred embodiment of the invention presented below, reference is made to the accompanying drawing of which:

FIGS. 2A to 2E are schematic diagrams showing main structures obtained in main processes of manufacturing the semiconductor laser device in FIG. 1;

FIG. 3 is a schematic diagram showing a sectional structure of a crystal growth furnace preferably used for the manufacture of the semiconductor laser device in FIG. 1;

FIG. 4A is a diagram showing a model of a band structure at a hetero interface between contact and intermediate band-gap layers of a semiconductor laser manufactured by a normal manufacturing technique;

FIG. 4B is a diagram showing a model of a band structure at a hetero interface between contact and intermediate band-gap layers of a semiconductor laser manufactured by an improved manufacturing technique according to the present invention;

FIG. 5 is a graph, based on experiments, showing dependency of the carrier density of a P-InGaP intermediate band-gap layer of the semiconductor laser according to the embodiment of the present invention on a crystal growth temperature, wherein the axis of ordinate represents carrier densities of intermediate band-gap layers respectively obtained at growth temperatures Tg of 600° C., 650° C., and 700° C, and the axis of abscissa represents a ratio of the molar flow rate of a III Group impurity material to the molar flow rate of DMZ (this ratio represents a DMZ supply flow rate in the growth furnace);

FIG. 7 is a schematic diagram showing a main portion of a laminated structure of a semiconductor laser, which is used to explain designing of an optimal size of the semiconductor laser according to the embodiment of the present invention in FIG. 1;

FIGS. 9A and 9B are schematic diagrams respectively showing flatnesses of contact layers of semiconductor lasers obtained under different design conditions;

DETAILED DESCRIPTION OF THE PREFERRED EMBODIMENT

Figure 1:
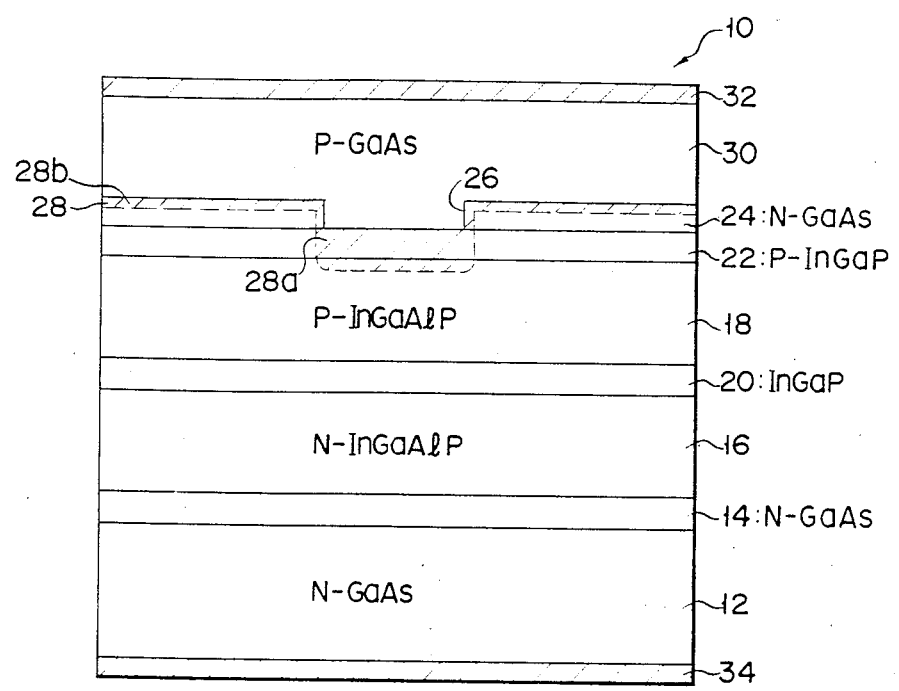
FIG. 1 is a schematic diagram showing a sectional arrangement of a gain waveguide type semiconductor laser device according to an embodiment of the present invention.

Referring now to FIG. 1, a gain-guiding type semiconductor laser according to an embodiment of the present invention, having a double-hetero structure, for oscillating a red light beam, is generally designated by reference numeral 10. A semiconductive substrate 12 having an N type conductivity is a gallium arsenide substrate (to be referred to as an "N-GaAs substrate" hereinafter). An N-GaAS layer 14 is formed on the substrate 12 as a buffer layer. First and second cladding layers 16 and 18 and an active layer 20 sandwiched therebetween are formed on the N-GaAs buffer layer 14, thus constituting a double-heterostructure. In this embodiment, the first cladding layer 16 is an N-$In_{0.5}(Ga_{0.3}Al_{0.7})_{0.5}P$ layer. The second cladding layer 18 is a P-$In_{0.5}(Ga_{0.3}Al_{0.7})_{0.5}P$ layer. The active layer 20 is an undoped $In_{0.5}Ga_{0.5}P$ layer.

A P-$In_{0.5}Ga_{0.5}P$ layer 22 is formed on the second cladding layer 18, and functions as an "intermediate band-gap layer". A current-blocking layer 24 is formed on the intermediate band-gap layer 22 so as to define an elongated opening 26 on the intermediate band-gap layer 22. The opening 26 serves as an opening (to be referred to as a "waveguide opening" hereinafter) for defining a waveguide channel for an oscillated laser beam in the double-heterostructure. It should be noted that an impurity diffusion region 28 (to be referred to as a "heavily-doped diffusion region" or more simply as "heavily-doped region" hereinafter) is formed in the surface regions of the intermediate band-gap layer 22 and the current-blocking layer 24 by doping an impurity, e.g., zinc (Zn), having the same conductivity type as that of the second cladding layer 18 therein. In order to allow easy visual understanding in FIG. 1, the heavily-doped region 28 is hatched. The carrier concentration of the heavily-doped layer 28 is higher than that of the intermediate band-gap layer 22 by about two times. In the laser structure shown in FIG. 1, if the intermediate band-gap layer 22 has a thickness of 0.05 nanometers and a carrier concentration of $3 \times 10^{17} cm^{-3}$, the carrier concentration of the heavily-doped layer 28 is set to be $1 \times 10^{18} cm \times 3$. A P-GaAs layer 30 is deposited on the current-blocking layer 24 so as to cover the waveguide opening 26, and serves as a contact layer for providing an ohmic contact. Conductive layers 32 and 34 are respectively formed on the surfaces of the substrate 12 and the contact layer 30. These layers 32 and 32 respectively serve as P and N type electrodes of the laser device.

As shown in FIG. 1, the heavily-doped layer 28 is shallow at the surface portion of the current-blocking layer 24, whereas it is deep at the layer portion (in which an injected current is blocked) of the intermediate layer 22 exposed to the waveguide opening 26. A deep portion 28a of the heavily-doped layer 28 is deep enough to locally extend to the top surface portion of the second cladding layer 18 located under the intermediate band-gap layer 22. An overlap portion of the deep portion 28a and the second cladding layer 18 has a depth equal to or smaller than that of a shallow portion 28b of the heavily-doped layer 28 at the current-blocking layer 24. As described above, since the carrier concentration of the heavily-doped layer 28 is 2 times or more that of the intermediate band-gap layer 22, the carrier concentration of the intermediate band-gap layer 22 is increased in the current-blocking region (28a), while that of the remaining region which is covered with the current-blocking layer 24 is decreased.

With such an arrangement, when the laser 10 is excited by supplying a driving current thereto, the injected current is blocked in the waveguide opening 26 by an inverted layer formed by the current blocking layer 24. As a result, laser emission occurs along the length of the opening 26 of the current-blocking layer 24 in the undoped InGaP active layer 20, thereby providing red laser oscillation having a wavelength of about 670 to 680 nanometers.

According to this embodiment, the intermediate band-gap layer 22 has an increased carrier concentration only at the central portion 28a abutting on the waveguide opening 26, and has a decreased carrier concentration at the remaining peripheral region. Therefore, the injected current does not spread to the layer region of the intermediate band-gap layer 22 under the current-blocking layer 24, and can be effectively concentrated substantially only in the waveguide channel portion of the laser device, thereby providing an effective current-blocking operation. Prevention of undesirable spreading of an injected current greatly contributes to minimization of ineffective power consumption and an increase in emission efficiency. The above-described "nonuniform carrier concentration" characteristic of the intermediate band-gap layer 22, at the same time, provides prevention of an undesirable increase in series resistance of the device as a result.

In addition, the device of the embodiment can be efficiently manufactured at a high manufacturing yield by using presently available manufacturing techniques. This is because effective current blocking can be realized by simply doping or diffusing a predetermined impurity in the intermediate band-gap layer 22 and the current-blocking layer 24 to additionally form the heavily-doped layer 28. In other words, the manufacture of this device does not require careful adjustment of an etching process for accurate thickness control of the intermediate band-gap layer 22 and/or careful initial thickness design of the intermediate band-gap layer 22 for compensating for overetching. The fact that high-performance semiconductor lasers can be manufactured by only adding one process of diffusing an impurity is bliss to the manufacturers of semiconductor lasers.

The formation of the heavily-doped layer 28 having a ununiform depth in the laser structure as shown in FIG. 1 can be effectively and easily performed in consideration of the level of the currently available impurity doping techniques. A manufacturing process of the above laser will be described in detail below with reference to FIGS. 2A to 2F.

As shown in FIG. 2A, a double-hetero junction structure is prepared by sequentially stacking the buffer layer 14, the first cladding layer 16 having a thickness of 1 $\mu$m, the active layer 20, and the second cladding layer 18 having a thickness of 1 $\mu$m on the semiconductive substrate 12 by a known metal organic chemical vapor deposition (MOCVD) method. A crystal growth process of the double-hetero junction structure was performed at an ambient temperature of 700° C., and excellent crystal characteristics were obtained in a double-hetero-junction portion. The intermediate band-gap layer 22 is formed on the second cladding layer 18 to have a thickness of 1 $\mu$m. An underlying layer 40 for forming the current-blocking layer 24 is deposited on the intermediate band-gap layer 22. In this embodiment, the layer 40 is a 1 $\mu$m thick GaAs layer of the N type conductivity. Subsequently, a photoresist layer 42 is deposited on the layer 40. As shown in FIG. 2A, a stripe-shaped opening 44 is formed in the photoresist layer 42 by using a known photolithographic technique.

Selective etching is then performed to etch out a portion of the underlying layer 40 exposed to the opening 44 of the photoresist layer 42, thus obtaining the current-blocking layer 24 having the waveguide opening 26, as shown in FIG. 2B. In order to make the opening 26 of the current-blocking layer 24 complete, i.e., to expose the top surface of the intermediate band-gap layer 22 through the opening 26 in an excellent state in this process, an etching solution having an etching rate different from that of an etching solution used for the underlying layer 40 for forming the current-blocking layer 24 is used as an etching solution for the intermediate band-gap layer 22. As such an etching solution, a mixed solution prepared by mixing sulfuric acid, hydrogen peroxide, and water at a volume ratio of 8:1:1 is preferably used.

Figure 2D:
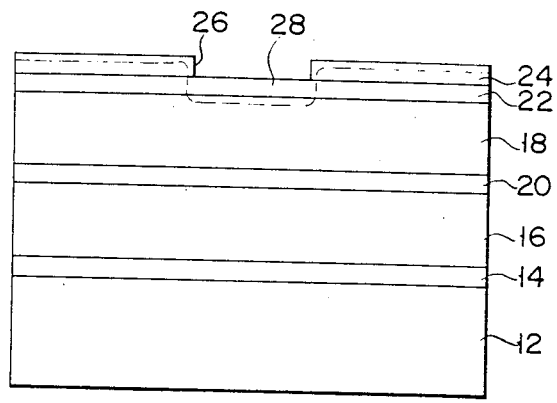

As shown in FIG. 2C, the photoresist layer 42 is then etched by using a known technique. As a result, the surface of the current-blocking layer 24 and a surface portion of the intermediate band-gap layer 22 exposed through the opening 26 of the current-blocking layer 24 are exposed. Thereafter, a laminated structure 46 shown in FIG. 2C is mounted on table-like susceptor 50 placed in a quartz reaction tube 51 of a reaction furnace 52 shown in FIG. 3, and is subjected to metal organic growth process. In this embodiment, zinc (Zn) is used as an organic metal. The atmosphere in the reaction chamber 52 is evacuated to a pressure of 50 Torr. The temperature in the furnace 52 is kept at a proper recrystallization temperature, e.g., 600° C., by an external heater 54 constituted by a high-frequency heating coil. In this process, a predetermined amount of dimethyl zinc (DMZ) as a material for an organic metal impurity is constantly fed from a feed port 56 of the reaction furnace 52 along an arrow 58 to the structure 46 placed on the table 50. As a result, zinc is diffused into the intermediate band-gap layer 22 and the surface portion of the current-blocking layer 24, thus forming the heavily-doped layer 28 indicated by the broken line in FIG. 2D. It should be noted that even if the supply amount of zinc in the furnace is constant, the diffusion depth of the intermediate band-gap layer 22 at the opening 26 is naturally increased due to a difference in diffusion rate of zinc in the intermediate band-gap layer 22 and the current-blocking layer 24. More specifically, since the diffusion rate of zinc in the intermediate band-gap layer 22 is larger than that of zinc in the current-blocking layer 24, diffusion in the exposed surface portion of the intermediate band-gap layer 22 at the opening 26 extends deeply enough to extend into the surface of the layer 18 under the layer 22. It is important that no specific manufacturing process control is required to realize such difference in diffusion depth of the heavily-doped layer 28.

Figure 2E:
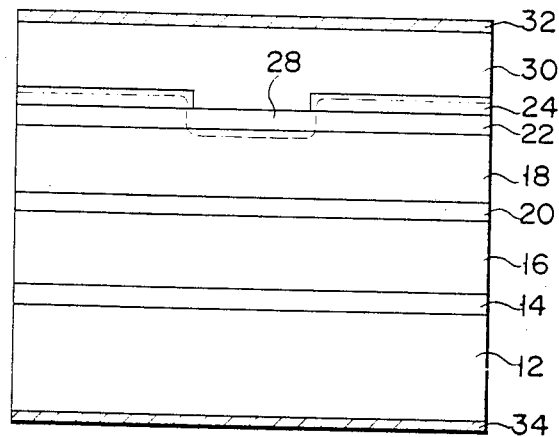

Subsequently, a contact layer 30 is formed on the resultant structure in the reaction furnace 52, thus finishing the second crystal growth process (recrystallization growth process). Thereafter, the gold zinc (AuZn) layer 32 is grown on the contact layer 30 as a P type electrode, whereas the gold germanium (AuGe) layer 34 is grown on the substrate 12 as an N type electrode, as shown in FIG. 2E. As a result, a gain-guiding semiconductor laser having the heavily-doped layer 28 according to the embodiment of the present invention is completed.

In the second crystal growth process, dimethyl zinc (DMZ) and as a material of an organic metal impurity and phosphine (PH$_3$) are constantly flowed in the reaction tube 51 prior to the growth process of the regrowing contact layer 30 (before temperature rise). The parallel flow of PH$_3$ suppresses evaporation of phosphorus component (P) from the layer portion of the P-InGaP intermediate band-gap layer 22 at the opening 26. Subsequently, the heater 54 is energized to increase the temperature in the furnace to a recrystallization growth temperature. The recrystallization temperature was set at 600° C. lower than the growth temperature in the first crystal growth process by 100° C. In addition the supply amount of DMZ in this process was set to be substantially equal to that of DMZ when the P-InGaP layer (active layer) 20 was grow in the first crystal growth process. After the temperature in the furnace reaches 600° C., arsine (AsH$_3$) is fed into the reaction chamber 52 in place of PH$_3$, thereby forming the contact layer 30, as shown in FIG. 2E. It was confirmed from experiments in trial manufacture by the present inventors that the carrier concentration of the intermediate band-gap layer 22 upon completion of the first crystal growth process was $3 \times 10^{17}$cm$^{-3}$, whereas the carrier concentration of the exposed portion of the intermediate band-gap layer 22 at the opening 26 (i.e., the carrier concentration of the heavily-doped layer 28a) was increased to $2 \times 10^{18}$cm$^{-3}$.

According to the manufacturing method of the present invention, in order to increase the carrier concentration of the intermediate band-gap layer 22 at the waveguide opening 26, i.e., to form the heavily-doped layer 28 in which the diffusion depths of the current-blocking layer 24 and the intermediate band-gap layer 22 are different from each other, a predetermined amount of an impurity (zinc) is constantly fed into the reaction furnace 52 in which the double-hetero junction structure is placed. No specific doping control technique is required to realize the heavily-doped layer 28 having different diffusion depths. This is because a desired heavily-doped layer 28 can be easily and accurately formed in the semiconductor laser structure by only utilizing the difference between diffusion rates of the impurity (zinc) used in this embodiment in the current-blocking layer 24 and the intermediate band-gap layer 22. Therefore, the semiconductor according to the embodiment of the present invention can be easily and efficiently manufactured in consideration of the level of the presently available manufacturing techniques. In addition, in the doping process of the impurity, since phosphine (PH$_3$) is also fed into the reaction furnace 52, evaporation of phosphorus from the intermediate band-gap layer 22 through the stripe-like opening 26 can be suppressed. This leads to an improvement in quality of a recrystallization interface in the laminated structure of the semiconductor laser.

Band structures of the hetero junction interface between the P-InGaP intermediate band-gap layer 22 and the P-GaAs contact layer 30 will be described below with reference to FIGS. 4A and 4B, wherein FIG. 4A shows a band structure in which the carrier concentration of the intermediate layer 22 has a relatively low value of $1 \times 10^{17}$cm$^{-3}$, and FIG. 4B shows a band structure in which the carrier concentration of the intermediate band-gap layer 22 is increased to $2 \times 10^{18}$cm$^{-3}$. In both the cases, the carrier concentration of the contact layer 30 is set to be $5 \times 10^{18}$cm$^{-3}$. As shown in FIG. 4A, when a current is flowed in a semiconductor laser in which the carrier concentration of a P-InGaP layer serving as the intermediate band-gap layer 22 is low as indicated by the arrow, a large "notch" is present on the hetero interface between the contact layer 30 and the intermediate band-gap layer 22, as indicated by a curve 60 as a model. This notch generates a hall barrier. A voltage drop in the semiconductor laser is undesirably increased by the hall barrier, resulting in a decrease in emission efficiency of the semiconductor laser. In contrast to this, according to a semiconductor laser in which the carrier concentration of the intermediate band-gap layer 22 is increased, a hetero-interface notch 62 between the contact layer 30 and the intermediate band-gap layer 22 is decreased, as shown in FIG. 4B. Therefore, the undesirable voltage drop can be minimized. This fact clearly demonstrates that the emission efficiency of semiconductor laser can be increased by forming the heavily-doped layer 28 in the intermediate band-gap layer 22 and increasing the carrier concentration thereof at the waveguide opening 26 according to the present invention.

As described above, according to the method of manufacturing a semiconductor laser according to the embodiment of the present invention, the growth temperature in the first crystal growth process must be set to be relatively high. In the above-described embodiment, the growth temperature of the first crystal growth process was 700° C. With such growth temperature setting, an InGaAlP-based double-hetero-junction structure having high crystal quality can be obtained. However, if zinc (Zn) is used as a P type impurity as in the above-described embodiment, the carrier concentration of the P-InGaP intermediate band-gap layer 22 cannot be expected to be satisfactorily increased by simply increasing the growth temperature because Zn has a high evaporation pressure. According to the above-described manufacturing method, therefore, the growth temperature in the second crystal growth process including growth of the contact layer 30 is set to be lower than that of the double-hetero-junction (e.g., 600° C.). In this case, Zn is flowed in the furnace 52 before the second crystal growth process is started so as to be diffused into the portion of the intermediate band-gap layer 22 defining the waveguide opening 26. With such an arrangement, the carrier concentration of the P-InGaP intermediate band-gap layer 22 can be sufficiently increased as required, since the partial pressure of Zn in the furnace 52 becomes higher than the evaporation pressure of Zn contained in the intermediate band-gap layer 22 even though the Zn supply amount in the furnace before the recrystallization is equal to that upon formation of the P-InGaP layer (intermediate band-gap layer 22). If the P-GaAs contact layer 30 is regrown on the resultant structure afterwards, a voltage drop at the regrowth interface can be extremely decreased.

In addition, according to the above-described manufacturing method, when the furnace temperature is to be increased to the growth temperature of the regrowing contact layer 30, phosphine (PH$_3$) is fed in the furnace 52 simultaneously with the P type impurity (Zn). Therefore, evaporation of phosphorus (P) from the intermediate layer 22 at the stripe-like opening 26 of the semiconductor laser can be effectively prevented or suppressed. Arsine (AsH$_3$) is alternatively fed in the furnace 52 in place of PH$_3$ before the regrowth process of the P-GaAs contact layer 30 is started. With this operation, an excellent regrowth interface can be obtained.

FIG. 5 shows a graph, based on experiments, showing the dependency of the carrier concentration of the P-InGaP intermediate band-gap layer 22 of the semiconductor laser on a growth temperature. In this graph, the carrier concentration of intermediate bandgap layers 22 respectively obtained at growth temperatures Tg of 600° C., 650° C., and 700° C. are plotted along the axis of ordinate, whereas the ratios of the molar flow rates of a III Group impurity material to DMZ molar flow rates (equivalent to DMZ supply flow rates in the growth furnace 52) are plotted along the axis of abscissa. As is understood from this graph, as the growth temperature Tg is increased, evaporation of Zn from the surface of a growing layer is promoted, and hence the carrier concentration of the growing layer is decreased. For example, when the growth temperature Tg was increased from 600° C. to 700° C., the carrier density was decreased to about 1/5.

As described above with reference to FIGS. 4A and 4B, in order to suppress an undesirable voltage drop at the GaAs/InGaP hetero-interface, the carrier concentration of the InGaP layer 22 serving as the intermediate band-gap layer must be set to be $1 \times 10^{18} cm^{-3}$ or more. However, in the first crystal growth process of the semiconductor laser, in order to obtain excellent crystal quality, the crystal growth temperature must be set to be 700° C. or more. Therefore, an intermediate band-gap layer 22 having a carrier concentration of $1 \times 10^{18} cm^{-3}$ or more is difficult to form. For this reason, in the regrowth period, the process of additionally performing Zn diffusion so as to increase the carrier concentration of the portion of the intermediate band-gap layer 22 defining on the waveguide opening 26 is required.

According to the method of manufacturing a semiconductor laser of the present invention, it is very important to set the recrystallization temperature and the supply flow rate of a P type III Group impurity (i.e., Zn in this embodiment) in the furnace during the increase period of the furnace temperature with high accuracy. It was found from experiments by the present inventors that the crystal growth temperature and the DMZ supply flow amount must be carefully set within the specific ranges, respectively, in which a carrier concentration of $1 \times 10^{18} cm^{-3}$ or more can be obtained, by referring to the dependency of the carrier concentration on the crystal growth temperature Tg shown in FIG. 5 in order to set the carrier concentration of the intermediate band-gap layer 22 to be $1 \times 10^{18} cm^{-3}$ by additionally diffusing Zn in the crystal growth period. According to the graph shown in FIG. 5, when the crystal growth temperature Tg in the regrowth process of the semiconductor laser is set to be 650° C., the DMZ supply flow rate must be set to be 1 or more. When the crystal growth temperature Tg is set to be 600° C., and the DMZ supply flow rate is set to be 0.4 or more, a carrier concentration of $1 \times 10^{18} cm^{-3}$ or more can be obtained. By setting the crystal growth temperature Tg to be as low as 600° C. in this manner, the range of the DMZ supply flow rate within which a proper carrier concentration can be obtained is widened. Therefore, reproducibility of the resultant intermediate band-gap layer 22 of the semiconductor laser can be improved. If the crystal growth temperature Tg is further decreased below 600° C., decomposition efficiency of the III Group impurity (Zn) is decreased. Hence, it is difficult to provide a regrowing layer having excellent crystal quality.

According to the method of manufacturing a semiconductor laser of the present invention, on the basis of the analysis results of the experiments, (1) the temperature at which the P-GaAs contact layer 30 was formed in the second crystal growth process was set to be lower than the temperature at which the double-heterostructure was formed in the first crystal growth process, and (2) DMZ was fed into the furnace 52 before rise of the ambient temperature in the furnace 52 for regrowth up to the regrowth temperature was completed, so that the carrier concentration of the P-InGaP intermediate band-gap layer 22 serving as the uppermost layer of the double-heterostructure was properly set so as to satisfy the above-described conditions. As a result, an undesirable voltage drop due to band discontinuity between the intermediate band-gap 22 and the contact layer 30 was effectively suppressed. At the same time, the voltage/-current characteristics of the semiconductor laser were improved, and its fundamental element characteristics were improved.

According to comparative experiments by the present inventors, semiconductor lasers (conventional elements) manufactured by setting the crystal growth temperature to be 700° C. throughout the first and second crystal growth processes without supplying DMZ had an output power of 3 mW, an operating voltage of 2.8 to 3.5 V at an operating temperature of 25° C., and a large variation among lasers. In contrast to this, in the semiconductor laser manufactured by using the manufacturing technique as described above, an operation voltage of 2.3 V was measured under the same conditions, and a variation between the elements was very small. In addition, the temperature characteristics of the semiconductor laser were improved, and its service life was prolonged.

The above-described manufacturing method of the present invention may be applied to the manufacture of a refractive index guiding semiconductor laser which is different from the gain guiding laser. This case will be described in detail below with reference to FIGS. 6A to 6F.

Figure 6A:
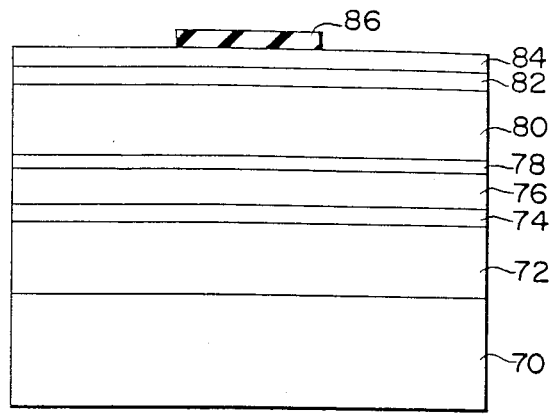
FIGS. 6A to 6F are schematic diagrams showing main structures obtained in main processes of manufacturing a refractive index waveguide type semiconductor laser device which is different from the semiconductor laser shown in FIG. 1.

As shown in FIG. 6A, an InGaAlP cladding layer 72, an InGaP active layer 74, a P-InGaAlP first cladding layer 76, a P-InGaP etching stopper layer 78, a P-InGaAlP second cladding layer 80, a P-InGaP intermediate band-gap layer 82, and a P-GaAs contact layer 84 are sequentially grown on an N-GaAs substrate 70 by using a known MOCVD method, thereby forming a double-heterostructure. A patterned insulating layer 86 is formed on the contact layer 84. The insulating layer 86 may be constituted by a silicon oxide ($SiO_2$) layer.

Figure 6B:
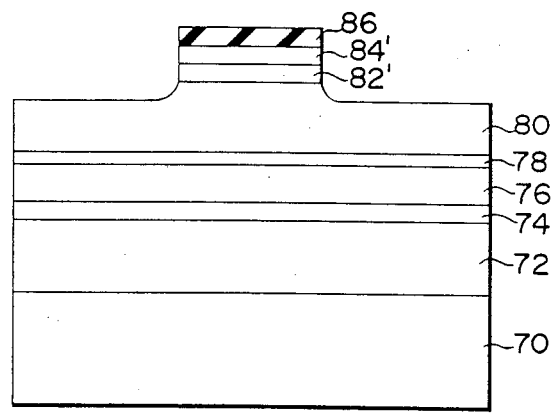
Figure 6C:
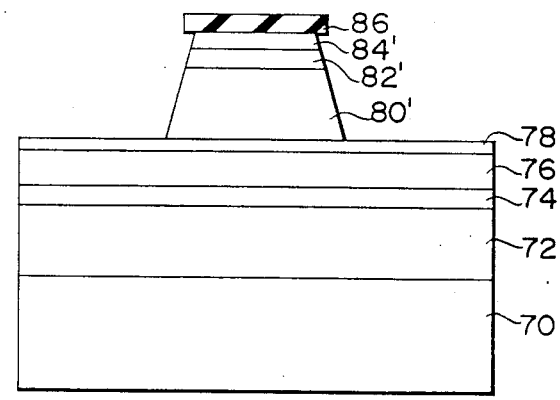

Subsequently, etching is performed by using a selected etching solution (e.g., $Br_2 + HBr + H_2O$) and the insulating layer as a mask. As a result, the intermediate band-gap layer 82 and the contact layer 84 are etched so as to have the same two-dimensional pattern as that of the mask layer 86, as shown in FIG. 6B. In FIG. 6B, reference numerals 82' and 84' respectively denote etched layers 82 and 84. At this time, the exposed top surface of the second cladding layer 80 under the layer 82 is locally etched.

The resultant structure is then subjected to a selective etching process using hot phosphoric acid. As a result, both side portions of the second cladding layer 80 are removed by etching to obtain a mesa-stripe portion having a trapezoidal section shown in FIG. 6C. The second cladding layer 80 subjected to selective etching is designated by reference numeral 80' in FIG. 6C.

Figure 6D:
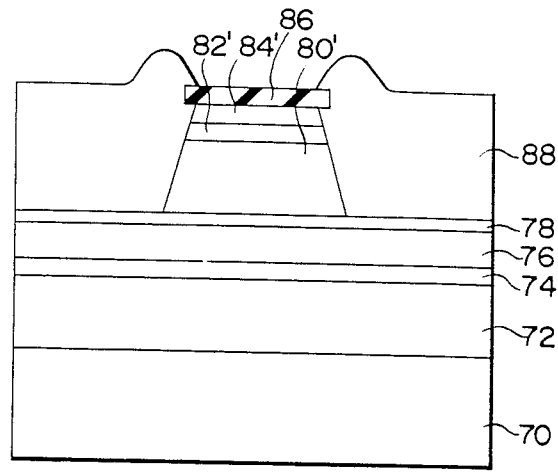

Subsequently, as shown in FIG. 6D, an N-GaAs layer 88 is regrown on the etching stopper layer 78 so as to cover the etched side portions of the second cladding layer 80. The N-GaAs layer 88 serves as a current-blocking layer of the semiconductor laser. In the regrowth process of the layer 88, a mixed gas of trimethyl gallium and arsine was used as a source gas. In this case, no growth of a GaAs layer was found on the insulating layer 86 used as a mask layer.

Figure 6E:
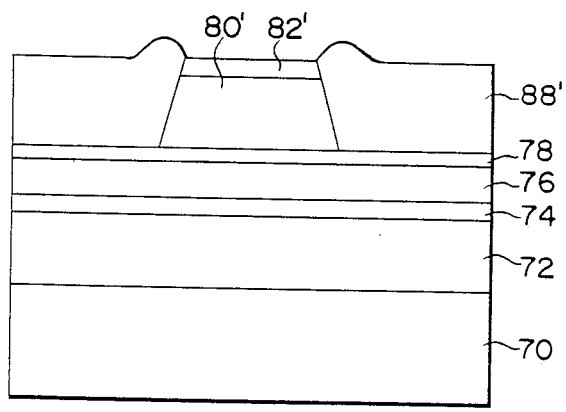

As shown in FIG. 6E, the mask layer 86 and the contact layer 84' are removed by a known technique. At this time, the top surface portion of the current-blocking layer 88 is slightly removed. The current-blocking layer thus obtained is designated by reference numeral 88

Figure 6F:
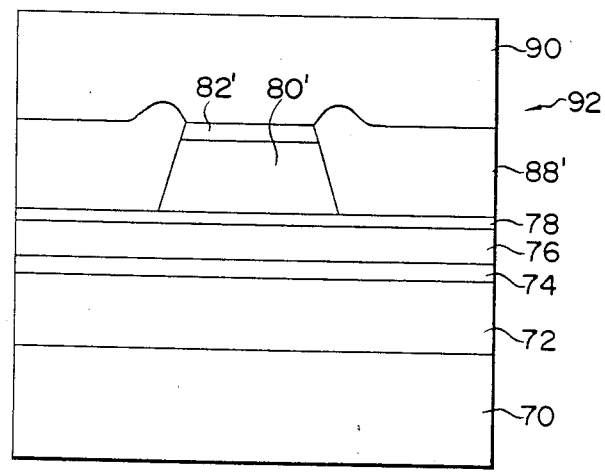

As shown in FIG. 6F, a P-GaAs layer 90 is regrown on the resultant structure by the MOCVD method. The layer 90 serves as a contact layer of the refractive index guiding semiconductor laser. When the P-GaAs contact layer 90 is to be grown, the above structure is placed on the table 50 of the crystal growth furnace 52 (see FIG. 3). In this case, a P type impurity (Zn) was constantly flowed in the furnace 52 as indicated by an arrow 58 in FIG. 3 before crystal growth was started, in the same as in the previous embodiment. The furnace temperature was set to be lower than the crystal growth temperature in the first crystal growth process for forming the double-hetero-junction structure, as in the case with the previous embodiment. A semiconductor laser thus manufactured on an experimental basis is generally designated by reference numeral 92 in FIG. 6F.

In the refractive index guiding semiconductor laser manufactured in this manner, the carrier concentration of the P-InGaP intermediate band-gap layer 82' can be satisfactorily increased while excellent crystal quality is maintained in the same manner as in the previously-described gain guiding semiconductor laser. Therefore, an undesirable voltage drop due to the band discontinuity between the intermediate band-gap layer 82' and the contact layer 90 can be suppressed or prevented. That is, the manufacturing method of the present invention can be effectively applied to the refractive index guiding semiconductor laser as well as the gain guiding semiconductor laser, and the same technical advantages can be obtained.

Device size setting of the semiconductor laser according to the embodiment of the present invention shown in FIG. 1 will be described below. When the semiconductor laser is to be sub-mounted, the laser structure shown in FIG. 1 is placed on a package substrate or a base plate, such as a stem, while the P type electrode 32 side is set to face down (such a mount method is known as a "P-side down method" by a person skilled in the art). In this case, in order to fix the semiconductor laser on the base plate, a fusing agent is used. Generally, a fusing agent projects to be in contact with the side surfaces of the structure of the semiconductor laser. Such projection of the fusing agent is not preferable because it causes a short circuit in the double-heterostructure portion. In order to solve this problem, (1) the thickness of a fusing material layer may be decreased, or (2) the thickness of the contact layer 30 may be increased to be larger than the projection height of the fusing agent. However, according to the former approach, separation of the semiconductor laser from the base plate may occur, and hence mounting reliability is degraded. According to the latter approach, the series and thermal resistances of the semiconductor laser are increased, and hence fundamental element characteristics are degraded.

In order to solve such a problem, the size of each component of the semiconductor laser of the present invention is designed to satisfy the following conditions:
(1) the thickness of the current-blocking layer 24 is set to be 0.5 to 0.7 μm;
(2) the impurity concentration of the heavily-doped layer 28 (the carrier concentration of the intermediate band-gap layer 22 at the waveguide opening 26) is set to be $1 \times 10^{18} cm^{-3}$ to $2 \times 10^{18} cm^{-3}$; and
(3) the thickness of the contact layer 30 is set to be 3.3 to 3.7 μm.

The above optimal design conditions were established on the basis of the results of experiments conducted by the present inventors.

FIG. 7 schematically shows a main part of the sectional structure of the semiconductor laser of the present invention. If the thicknesses of the contact layer 30 and the current-blocking layer 24 are respectively represented by "L" and "M" and the width of the waveguide opening 26 is represented by "W" as shown in FIG. 7, $$\left. \begin{array}{l} 3.3 \ \mu m \leq L \leq 3.7 \ \mu m \\ 0.5 \ \mu m \leq M \leq 0.7 \ \mu m \ \text{(upper limit)} \\ 5 \ \mu m \leq W \leq 7 \ \mu m \end{array} \right\}$$

It should be noted that the thickness and impurity density of the current-blocking layer 24 are determined by a breakdown voltage required for the layer 24. The breakdown voltage is set to be larger than the operating voltage (normally, 2.4 to 3.0 V) of the semiconductor laser. In order to provide a such breakdown voltage of the semiconductor laser, the thickness M must be set to be at least 0.5 μm, preferably more. The impurity concentration of the current-blocking layer 24 was set to be at least $1 \times 10^{18} \text{cm}^{-3}$ or more. From the viewpoint of the manufacturing process, the thickness and impurity concentration of the current-blocking layer 24 are preferably minimized. In consideration of this point, the upper limit of the thickness M of the current-blocking layer 24 is set to be 0.7 μm, and the upper limit of its impurity concentration was especially set to be $2 \times 10^{18} \text{cm}^{-3}$ (this value can be easily realized by a presently available doping technique).

The present inventors manufactured semiconductors on an experimental basis by various changing the thickness L of the contact layer 30 on the basis of the above design conditions. The flatness, short-circuit characteristics, and operating temperature characteristics of these semiconductor lasers were measured. The experiment results will be described below with reference to FIGS. 8 to 11.

Figure 8:
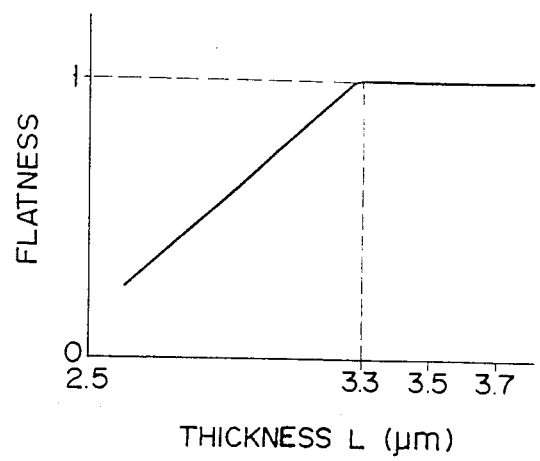
FIG. 8 is a graph, based on measurement, showing a change in flatness of the top surface of a contact layer 30 as a function of a thickness L of a current-blocking layer.

FIG. 8 is a graph showing a change in flatness of the top surface of the contact layer 30 as a function of the thickness L of the current-blocking layer 24. The term "flatness" is defined by the size of a recess formed in the top surface of the contact layer 30: the flatness is set to be "1" when the top surface of the contact layer 30 is made completely flat, and the flatness is "0" when the size of a recess is equivalent to the thickness of the contact layer 30. As is apparent from FIG. 8, when the thickness L of the contact layer 30 is smaller than 3.3 μm, its flatness is smaller than 1. In this case, a recess 100 is formed in the top surface of the contact layer 30 in accordance with the recess shape of the waveguide opening 26 of the current-blocking layer 24, as shown in FIG. 9A. When the thickness L is equal to or larger than 3.3 μm, the flatness of the contact layer 30 becomes 1. In this case, the top surface of the contact layer 30 is made completely flat, as shown in FIG. 9B.

Figure 10:
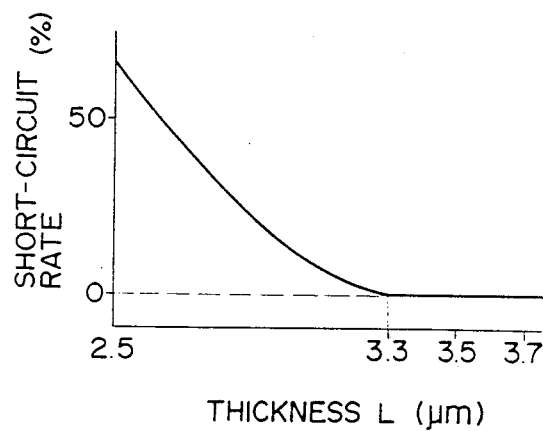
FIG. 10 is a graph, based on measurement, showing a change in short-circuit rate when semiconductor lasers are fused to base plates as a function of the thickness L of the current-blocking layer.

FIG. 10 is a graph showing a change in short-circuit rate when semiconductor lasers are fused to base plates as a function of the thickness L of the current-blocking layer 24. As is apparent from this graph, when the thickness L of the contact layer 30 is smaller than 3.3 μm, its short-circuit rate is increased. For example, when the thickness L is 2.5 μm, the short-circuit rate of the semiconductor laser exceeds 50%. This means that more than half of the manufactured semiconductor lasers are defective. In contrast to this, it was confirmed that only when the thickness L was equal to or larger than 3.3 μm, short-circuit rate of the semiconductor lasers became zero.

Figure 11:
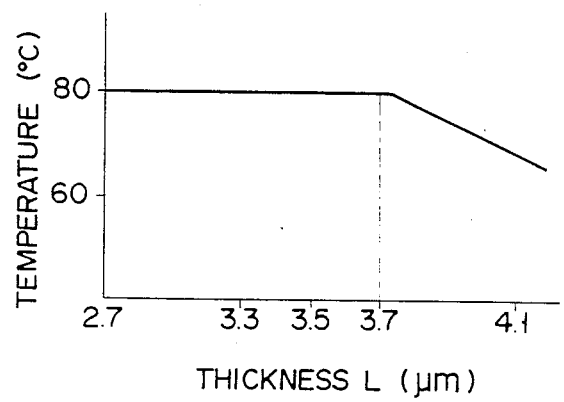
FIG. 11 is a graph, based on measurement, showing a change in maximum operating temperature (i.e., a maximum temperature allowing a proper operation of a semiconductive laser) of semiconductive lasers as a function of the thickness L of the current-blocking layer.

FIG. 11 is a graph showing change in maximum operating temperature (i.e., a maximum temperature at which a semiconductor laser can be properly operated) as a function of the thickness L of the current-blocking layer 24. As is apparent from this graph, when the thickness L of the contact layer 30 is larger than 3.7 μm, its maximum operating temperature is greatly decreased from 80° C. In the worst case, laser oscillation of the semiconductor laser is stopped. Such a drop in maximum operating temperature is caused since the thermal and electric series resistances of a semiconductor laser are increased as the thickness L of the contact layer 30 is increased. When the thickness L is equal to or larger than 3.7 μm, the maximum operating temperature of the semiconductor laser was maintained at 80° C. in an excellent state.

Although the invention has been described with reference to a specific embodiment, it shall be understood by those skilled in the art that numerous modifications may be made that are within the spirit and scope of the invention contribution.

The materials of the semiconductor layers constituting the double-heterostructure of the semiconductor laser according to the present invention are not limited to those in the above-described embodiment. As shown in FIG. 1, for example, in the device of the above-described embodiment, the intermediate band-gap layer 22 is constituted by the P type InGaP layer. However, the layer 22 may be alternatively constituted by an N type InGaP layer or an undoped InGaP layer. It was already confirmed by the present inventors that the same effects as those described in the embodiment could be obtained by using such materials. In addition, the semiconductor laser of the present invention can be modified such that a heavily-doped GaAs layer having the same conductivity type a that of the contact layer 30 is additionally formed between the contact layer 30 and the electrode 32 shown in FIG. 1. The formation of such an additional contact layer may contribute to an improvement in electrical junction characteristics of the electrode 32. The additional contact layer can be easily formed on the contact layer 30 in the second crystal growth process of the semiconductor laser performed in the growth furnace (see FIG. 3) by regrowing a P+ type GaAs layer on the contact layer 30.

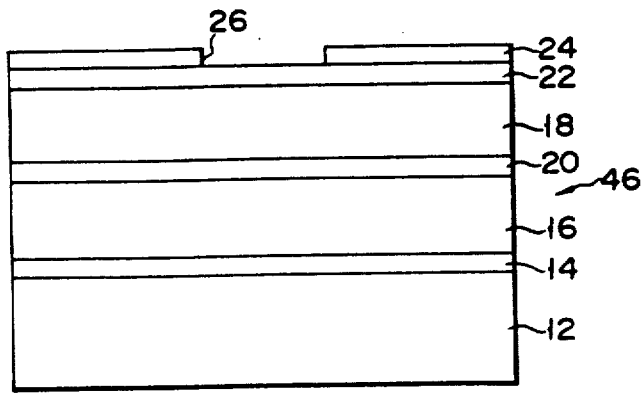

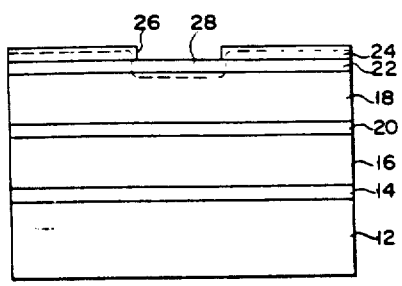

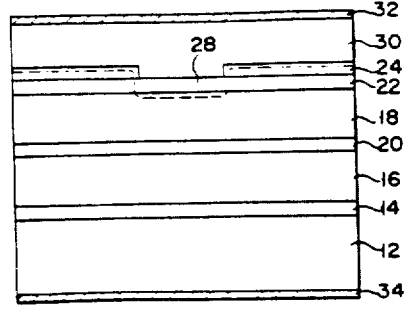

What is claimed is:

1. A method of manufacturing a semiconductor laser device for oscillating visible light, comprising the steps of:

(a) forming a double-heterostructure disposed on a semiconductive substrate having a first conductivity type by semiconductor crystal growth, said double-heterostructure including
a semiconductive active layer, and
first and second cladding layers sandwiching said active layer and having different conductivity types, said first cladding layer consisting of a semiconductive material having the first conductivity type, said second cladding layer consisting of a semiconductive material having a second conductivity type;

(b) forming by crystal growth a semiconductive layer on said second cladding layer;

(c) forming by crystal growth a semiconductive current-blocking layer of the first conductivity type having an elongated opening; and (d) forming by crystal growth a semiconductive contact layer of the second conductivity type so as to cover said current-blocking layer and said opening, the improvement wherein
a selected impurity is supplied in a crystal growth furnace from a timing prior to crystal growth of said contact layer, so that the impurity is at least locally doped in said semiconductive layer to increase a carrier concentration thereof, and wherein
said contact layer is formed by crystal growth after a furnace temperature is increased to a crystal growth temperature of said contact layer, which is lower than a temperature in crystal growth of said double-heterostructure.

2. The method according to claim 1, wherein the impurity is flowed in the furnace together with phosphine, and is flowed in the furnace together with arsine when said contact layer is formed.

3. The method according to claim 2, wherein the impurity is substantially constantly flowed in the furnace.

4. The method according to claim 2, wherein the impurity includes zinc.

5. The method according to claim 2, wherein said semiconductive layer has an intermediate band gap between band gaps of said second cladding layer and said contact layer.

6. The method according to claim 5, wherein upon diffusion of the impurity into said intermediate band-gap layer, said intermediate band-gap layer has a carrier concentration, in a first region defining said opening, substantially high enough to cause a current injected in an oscillation mode of said device to concentrate on said region, and has a carrier concentration, in a second region as the remaining portion, low enough to suppress or prevent the injected current from spreading into said second region.

7. The method according to claim 2, wherein said double-heterostructure is etched together with said semiconductive layer to form a mesa stripe, which has side end portions bonded to said current-blocking layer.

* * * * *

UNITED STATES PATENT AND TRADEMARK OFFICE
CERTIFICATE OF CORRECTION

Page 1 of 2

PATENT NO. : 4,987,097

DATED : January 22, 1991

INVENTOR(S) : Koichi Nitta et al

It is certified that error appears in the above-identified patent and that said Letters Patent is hereby corrected as shown below:

ON TITLE PAGE:
For the drawing Sheets, please delete, "22" and insert, --9--.

to appear as per attached title page.

Signed and Sealed this

Tenth Day of November, 1992

*Attest:*

DOUGLAS B. COMER

*Attesting Officer*   Acting Commissioner of Patents and Trademarks

United States Patent [19]

Nitta et al.

[11] Patent Number: 4,987,097
[45] Date of Patent: Jan. 22, 1991

[54] METHOD OF MANUFACTURING A SEMICONDUCTOR LASER DEVICE

[75] Inventors: Koichi Nitta, Kawasaki; Yukie Nishikawa, Narashino; Masayuki Ishikawa, Nishimine; Yasuhiko Tsuburai, Sagamihara; Yoshihiro Kokubun, Yokohama, all of Japan

[73] Assignee: Kabushiki Kaisha Toshiba, Kawasaki, Japan

[21] Appl. No.: 486,397

[22] Filed: Feb. 28, 1990

Related U.S. Application Data

[62] Division of Ser. No. 307,927, Feb. 9, 1989, Pat. No. 4,922,499.

[30] Foreign Application Priority Data

Feb. 9, 1988 [JP] Japan ............... 63-26490
May 13, 1988 [JP] Japan ............... 63-116704
Jul. 11, 1988 [JP] Japan ............... 63-172312

[51] Int. Cl.$^5$ .............................. H01L 21/20
[52] U.S. Cl. ............... 437/129; 148/DIG. 95; 148/DIG. 157; 437/133; 437/154; 437/950; 437/987
[58] Field of Search ............ 148/DIG. 2, 3, 18, 30, 148/36, 44, 50, 56, 65, 72, 90, 95, 97, 110, 157, 169; 357/16, 17; 372/43, 46, 48, 50, 45; 437/81, 82, 90, 105, 107, 108, 110, 126, 129, 133, 247, 153, 154, 157, 165, 936, 943, 949, 950, 955, 887

[56] References Cited

U.S. PATENT DOCUMENTS

| | | | |
|---|---|---|---|
| 4,213,808 | 7/1980 | Thompson et al. | 372/46 |
| 4,517,674 | 5/1985 | Liu et al. | 372/46 |
| 4,546,479 | 10/1985 | Ishikawa et al. | 372/46 |
| 4,635,268 | 1/1987 | Motegi et al. | 372/46 |
| 4,675,074 | 6/1987 | Wada et al. | 437/129 |
| 4,734,385 | 3/1988 | Mihashi et al. | 437/129 |
| 4,792,958 | 12/1988 | Ohba et al. | 372/45 |
| 4,799,228 | 1/1989 | Nagasaka et al. | 372/46 |
| 4,839,307 | 6/1989 | Imanaka et al. | 437/129 |

FOREIGN PATENT DOCUMENTS

| | | |
|---|---|---|
| 0066891 | 4/1985 | Japan . |
| 0137088 | 7/1985 | Japan . |
| 62-16592 | 1/1987 | Japan . |
| 62-200784 | 9/1987 | Japan . |

OTHER PUBLICATIONS

Yamashita et al., "GaAlAs Gain-Guided Semiconductor Lasers...", Appl. phys. Lett., vol. 51, No. 21, Nov. 23, 1987, pp. 1667-1669.

Primary Examiner—Olik Chaudhuri
Assistant Examiner—William Bunch
Attorney, Agent, or Firm—Oblon, Spivak, McClelland, Maier & Neustadt

[57] ABSTRACT

A gain waveguide type semiconductor laser oscillating visible light has an N type GaAs substrate of, and a double-heterostructure provided above the substrate to include an InGaP active layer, and first and second cladding layers sandwiching the active layer. The first cladding layer consists of N type InGaAlP, whereas the second cladding layer consists of P type InGaAlP. A P type InGaP layer is formed as an intermediate band-gap layer on the second cladding layer. An N type GaAs current-blocking layer is formed on the intermediate band-gap layer, and has an elongated waveguide opening. A P type GaAs contact layer is formed to cover the current-blocking layer and the opening. The intermediate band-gap layer has a carrier concentration, in a layer portion being in contact with the opening, high enough to cause a current injected in the oscillation mode to concentrate on the layer portion and has a carrier density, in the remaining layer portion, low enough to suppress or prevent the injected current from spreading thereinto. The layer portion may be formed by additionally doping a selected impurity into the intermediate gap layer by using a presently available impurity diffusion/injection technique.

7 Claims, 9 Drawing Sheets